US012230562B2

(12) United States Patent
Chang

(10) Patent No.: US 12,230,562 B2
(45) Date of Patent: Feb. 18, 2025

(54) THREE-DIMENSIONAL PAD STRUCTURE AND INTERCONNECTION STRUCTURE FOR ELECTRONIC DEVICES

(71) Applicant: MEDIATEK INC., Hsin-Chu (TW)

(72) Inventor: Chin-Chiang Chang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 338 days.

(21) Appl. No.: 17/691,056

(22) Filed: Mar. 9, 2022

(65) Prior Publication Data
US 2022/0328394 A1   Oct. 13, 2022

Related U.S. Application Data

(60) Provisional application No. 63/171,637, filed on Apr. 7, 2021.

(51) Int. Cl.
*H01L 23/498* (2006.01)
*H01L 23/31* (2006.01)

(52) U.S. Cl.
CPC .. *H01L 23/49838* (2013.01); *H01L 23/49816* (2013.01); *H01L 23/3128* (2013.01)

(58) Field of Classification Search
CPC ......... H01L 23/49838; H01L 23/49816; H01L 23/3128; H01L 21/4853; H01L 2224/05557; H01L 2224/11849; H01L 2224/13017; H01L 2224/13018; H01L 2224/13022; H01L 2224/131; H01L 2224/13147; H01L 2224/13562; H01L 2224/16227; H01L 2924/15311; H01L 23/49811; H01L 24/04; H01L 24/05; H01L 24/13; H01L 24/16; H01L 24/11; H01L 2224/13009; H01L 2224/13019; H01L 2224/13025
See application file for complete search history.

(56) References Cited

U.S. PATENT DOCUMENTS

| 5,788,143 | A | * | 8/1998 | Boyd | H01L 21/67144 228/253 |
| 5,869,889 | A | * | 2/1999 | Chia | H01L 23/4985 257/E23.101 |
| 5,962,918 | A | * | 10/1999 | Kimura | H01L 24/10 257/784 |
| 6,025,650 | A | * | 2/2000 | Tsuji | H01L 23/3114 257/691 |

(Continued)

FOREIGN PATENT DOCUMENTS

| JP | 2000-164617 A | 6/2000 |
| JP | 2014-192177 | 10/2014 |

(Continued)

OTHER PUBLICATIONS

JPH11297873_translation. Terunao (Year: 1999).*

(Continued)

*Primary Examiner* — Binh B Tran
*Assistant Examiner* — Muhammed Azam
(74) *Attorney, Agent, or Firm* — Winston Hsu

(57) ABSTRACT

A three-dimensional pad structure includes a substrate; a pad disposed on the substrate, wherein a perimeter of the pad is covered with a solder mask; and at least one conductive pillar protruding from a top surface of the pad.

27 Claims, 5 Drawing Sheets

(56) References Cited

U.S. PATENT DOCUMENTS

| | | | | |
|---|---|---|---|---|
| 6,084,300 | A * | 7/2000 | Oka | H01L 23/3107 |
| | | | | 257/730 |
| 6,214,716 | B1 * | 4/2001 | Akram | H01L 23/49811 |
| | | | | 438/612 |
| 6,350,632 | B1 * | 2/2002 | Lin | H01L 24/13 |
| | | | | 257/E23.068 |
| 6,403,460 | B1 * | 6/2002 | Lin | H01L 21/2885 |
| | | | | 438/618 |
| 6,511,865 | B1 * | 1/2003 | Lin | H01L 24/05 |
| | | | | 257/E23.068 |
| 6,576,539 | B1 * | 6/2003 | Lin | H01L 24/11 |
| | | | | 438/641 |
| 6,818,545 | B2 * | 11/2004 | Lee | H01L 24/11 |
| | | | | 257/E21.705 |
| 7,075,186 | B1 * | 7/2006 | Wang | H01L 24/18 |
| | | | | 257/E23.068 |
| 7,129,113 | B1 * | 10/2006 | Lin | H01L 24/82 |
| | | | | 257/E21.507 |
| 7,241,640 | B1 * | 7/2007 | Zhang | H05K 3/3436 |
| | | | | 257/69 |
| 7,262,082 | B1 * | 8/2007 | Lin | H01L 21/6835 |
| | | | | 438/109 |
| 7,319,265 | B1 * | 1/2008 | Wang | H01L 21/486 |
| | | | | 257/737 |
| 7,361,531 | B2 * | 4/2008 | Sharma | H01L 24/16 |
| | | | | 257/E23.047 |
| 7,414,319 | B2 * | 8/2008 | Lin | H01L 23/5389 |
| | | | | 257/E23.056 |
| 7,700,475 | B1 | 4/2010 | Kao | |
| 7,902,679 | B2 * | 3/2011 | Lin | H01L 24/06 |
| | | | | 257/737 |
| 7,919,868 | B2 * | 4/2011 | Hedler | H01L 23/3128 |
| | | | | 257/738 |
| 7,939,934 | B2 * | 5/2011 | Haba | H05K 3/3436 |
| | | | | 257/737 |
| 8,115,310 | B2 * | 2/2012 | Masumoto | H01L 24/16 |
| | | | | 257/737 |
| 8,315,063 | B2 * | 11/2012 | Hsu | H05K 3/4007 |
| | | | | 361/767 |
| 8,659,153 | B2 * | 2/2014 | Fay | H01L 21/56 |
| | | | | 257/737 |
| 8,884,432 | B2 * | 11/2014 | Sakuma | H05K 3/002 |
| | | | | 257/781 |
| 9,165,875 | B2 * | 10/2015 | Yu | H01L 24/97 |
| 9,305,895 | B2 * | 4/2016 | Yoo | H01L 24/81 |
| 9,350,124 | B2 * | 5/2016 | Rathburn | H01R 13/2457 |
| 9,646,944 | B2 * | 5/2017 | Yang | H01L 23/544 |
| 9,761,520 | B2 * | 9/2017 | Rathburn | H01L 23/49811 |
| 9,984,960 | B2 * | 5/2018 | Hwang | H01L 24/73 |
| 10,159,154 | B2 * | 12/2018 | Rathburn | C25D 5/022 |
| 10,269,672 | B2 * | 4/2019 | Fang | H01L 24/11 |
| 10,667,410 | B2 * | 5/2020 | Rathburn | H05K 3/4623 |
| 10,716,213 | B2 * | 7/2020 | Kim | H05K 1/117 |
| 10,756,040 | B2 * | 8/2020 | Yu | H01L 24/14 |
| 10,825,761 | B2 * | 11/2020 | Wirz | H01L 24/13 |
| 10,825,773 | B2 * | 11/2020 | Yu | H01L 24/32 |
| 11,233,024 | B2 * | 1/2022 | Jensen | H01L 24/13 |
| 2001/0011777 | A1 * | 8/2001 | Kano | H01L 23/49816 |
| | | | | 257/781 |
| 2002/0096757 | A1 * | 7/2002 | Takao | H01L 24/05 |
| | | | | 257/E23.021 |
| 2004/0126927 | A1 * | 7/2004 | Lin | H01L 24/48 |
| | | | | 257/E21.705 |
| 2005/0194695 | A1 * | 9/2005 | Lin | H01L 25/0657 |
| | | | | 257/E21.705 |
| 2006/0237855 | A1 * | 10/2006 | Kroehnert | H01L 23/49838 |
| | | | | 257/781 |
| 2007/0034401 | A1 * | 2/2007 | Shim | H01L 23/49816 |
| | | | | 174/250 |
| 2009/0174069 | A1 * | 7/2009 | Nguyen | H01L 24/16 |
| | | | | 257/737 |
| 2009/0243100 | A1 * | 10/2009 | Akiyama | H01L 23/481 |
| | | | | 257/738 |
| 2010/0044884 | A1 | 2/2010 | Zbrzezny | |
| 2011/0227216 | A1 * | 9/2011 | Tseng | H01L 24/11 |
| | | | | 257/737 |
| 2012/0306104 | A1 | 12/2012 | Choi | |
| 2015/0118801 | A1 * | 4/2015 | Harada | H01L 23/49838 |
| | | | | 438/126 |
| 2015/0333022 | A1 | 11/2015 | Albers | |
| 2015/0340308 | A1 * | 11/2015 | Law | H01L 23/3121 |
| | | | | 257/690 |
| 2016/0005726 | A1 * | 1/2016 | Chen | H01L 25/03 |
| | | | | 257/737 |
| 2016/0079205 | A1 * | 3/2016 | Lin | H01L 24/25 |
| | | | | 257/737 |
| 2018/0053665 | A1 * | 2/2018 | Kuo | H01L 24/81 |
| 2019/0122974 | A1 * | 4/2019 | Goh | H01L 23/31 |
| 2020/0118955 | A1 * | 4/2020 | Gogineni | H01L 23/49811 |
| 2022/0165694 | A1 * | 5/2022 | Huang | H01L 23/49811 |
| 2022/0328394 | A1 * | 10/2022 | Chang | H01L 23/49816 |

FOREIGN PATENT DOCUMENTS

| | | |
|---|---|---|
| JP | 2014-192177 A | 10/2014 |
| WO | 2014/199890 A1 | 12/2014 |

OTHER PUBLICATIONS

JPH10256418_translation (Year: 1998).*
KR100598329_translation (Year: 2006).*
TWI434385_translation (Year: 2014).*

* cited by examiner

THREE-DIMENSIONAL PAD STRUCTURE AND INTERCONNECTION STRUCTURE FOR ELECTRONIC DEVICES

CROSS REFERENCE TO RELATED APPLICATIONS

This application claims priorities from U.S. provisional application No. 63/171,637 filed on Apr. 7, 2021, the disclosure of which is included in its entirety herein by reference.

BACKGROUND

The present disclosure relates generally to an improved conductive ball pad and an interconnection structure for electronic components or devices.

Ball grid array (BGA) packages are rapidly gaining acceptance in the electronics industry as a low-cost, higher yielding alternative to fine pitch leaded packages. Conductive solder joints are formed to mechanically and electrically interconnect the pads on the component/device with the corresponding pads on the substrate. Whether structural or electronic, all solder joints must provide the necessary level of reliability for the application.

As known in the art, the inter-metallic compound (IMC) layer is the key to form the good soldering but it is also the weakest layer in the whole soldering structure. The IMC layer with poor mechanical strength is damaged easily during undergoing process mechanical stress, even though process strain level is within design specification.

It is desired to provide an improved interconnection structure that is capable of solving the crack phenomenon on current printed circuit board assembly (PCBA) without changing any BGA produced process.

SUMMARY

One object of the present invention is to provide a three-dimensional conductive ball pad, an improved interconnection structure, and semiconductor package using the same, in order to solve the above-mentioned prior art problems or shortcomings.

One aspect of the disclosure provides a three-dimensional pad structure including a substrate; a pad disposed on the substrate, wherein a perimeter of the pad is covered with a solder mask; and at least one conductive pillar protruding from a top surface of the pad.

According to some embodiments, the substrate is a package substrate having a component side and a board side, wherein the pad is disposed on the board side of the package substrate.

According to some embodiments, the pad is a copper pad.

According to some embodiments, the at least one conductive pillar is a copper pillar.

According to some embodiments, a height of the conductive pillar above the top surface of the pad approximately equals to a height of the solder mask above the top surface of the pad.

According to some embodiments, the three-dimensional pad structure further comprises a surface solderable coating or an organic solderability preservative (OSP) on the top surface of the pad.

According to some embodiments, a top surface of the conductive pillar is flush with a top surface of the solder mask.

According to some embodiments, an undercut is provided on a sidewall of the conductive pillar, thereby constituting a curved sidewall profile.

According to some embodiments, the conductive pillar comprises a neck portion that is thinner than its head and base.

According to some embodiments, the neck portion has a smooth, curved surface.

According to some embodiments, a width of the head of the conductive pillar is about 50 micrometers.

According to some embodiments, the three-dimensional pad structure further comprises an annular recess on the pad and around the conductive pillar.

Another aspect of the disclosure provides an interconnection structure including a substrate; a pad disposed on the substrate, wherein a perimeter of the pad is covered with a solder mask; at least one conductive pillar protruding from a top surface of the pad; and a conductive ball disposed on the pad and surrounds the conductive pillar, wherein the at least one conductive pillar and the conductive ball interlock, and wherein the conductive ball is anchored to the pad.

According to some embodiments, conductive ball completely surrounds the conductive pillar.

According to some embodiments, the substrate is a package substrate having a component side and a board side, wherein the pad is disposed on the board side of the package substrate.

According to some embodiments, the pad is a copper pad.

According to some embodiments, the at least one conductive pillar is a copper pillar.

According to some embodiments, the interconnection structure further comprises a surface solderable coating or an organic solderability preservative (OSP) on the top surface of the pad.

According to some embodiments, an undercut is provided on a sidewall of the conductive pillar, thereby constituting a curved sidewall profile.

According to some embodiments, the conductive pillar comprises a neck portion that is thinner than its head and base.

According to some embodiments, the neck portion has a smooth, curved surface.

According to some embodiments, a width of the head of the conductive pillar is about 50 micrometers.

According to some embodiments, the interconnection structure further comprises an annular recess on the pad and around the conductive pillar.

According to some embodiments, the pad is a corner pad.

Still another aspect of the disclosure provides a three-dimensional pad structure including a substrate; a pad disposed on the substrate, wherein a perimeter of the pad is covered with a solder mask; and recessed regions provided on a top surface of the pad; and at least one protruding feature between the recessed regions.

According to some embodiments, the recessed regions are isolated from one another by the protruding feature.

According to some embodiments, the recessed regions communicate with one another to form a network or interlacing pattern.

According to some embodiments, the protruding feature between the recessed regions has a top surface that is flush with the top surface of the pad.

According to some embodiments, the substrate is a package substrate having a component side and a board side, wherein the pad is disposed on the board side of the package substrate.

According to some embodiments, the pad is a copper pad.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

In ball grid array (BGA) packages, instead of a lead frame, an organic substrate is typically used. The substrate is generally made of bismaleimide triazine or polyimide. The chip is mounted to the top of the substrate, and conductive balls constructed on the bottom of the substrate make connections to the circuit board. This design allows for shorter circuit interconnect lengths, which improve electrical performance, as well as a smaller package size. In the BGA packaging, the integrated circuit (IC) component, solder joints and printed circuit board (PCB) form a three-layer construction.

Drop induced interconnect failure is a major reliability concern for portable electronic applications. Failure typically occurs at package/solder interface at corner BGA balls, which results in lower I/O density because corner BGA balls are not I/O balls in consideration of board level reliability (BLR) concern. BLR has been the one of the critical issue for using BGA packages in automotive. The required specification of BLR is listed in various standards (AEC-Q100, Q104, etc.) and it is varied by automotive application customers.

The present disclosure pertains to a novel three-dimensional (3D) conductive ball pad for mechanical and electrical interconnection between opposing electrodes of electronic components/devices, functional modules, and substrates, and an interconnection structure formed with conductive joint and the 3D conductive ball pad.

Figure 1:
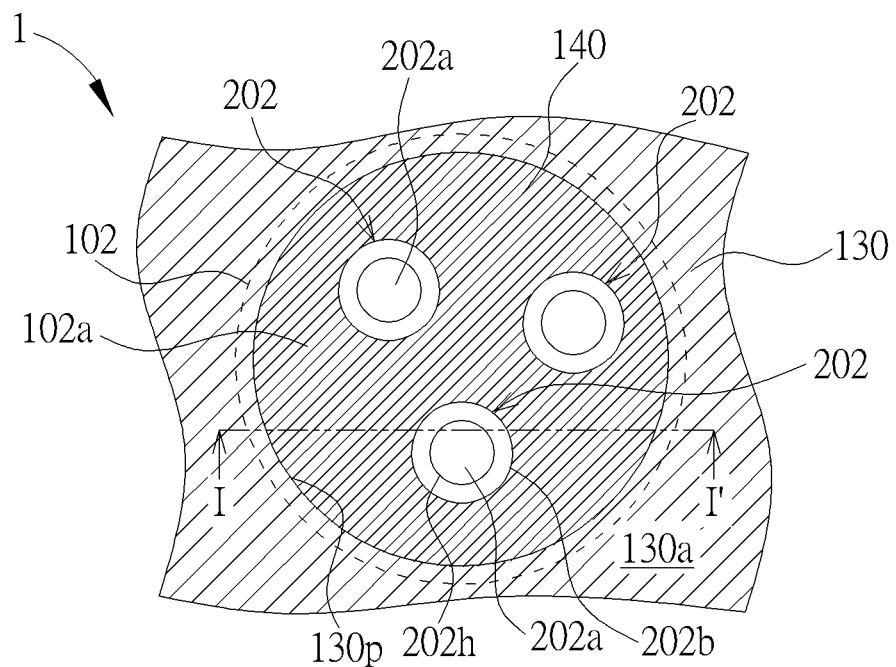
FIG. 1 is a perspective top view diagram showing a germane portion of an exemplary semiconductor package in accordance with one embodiment of the invention.
Figure 2:
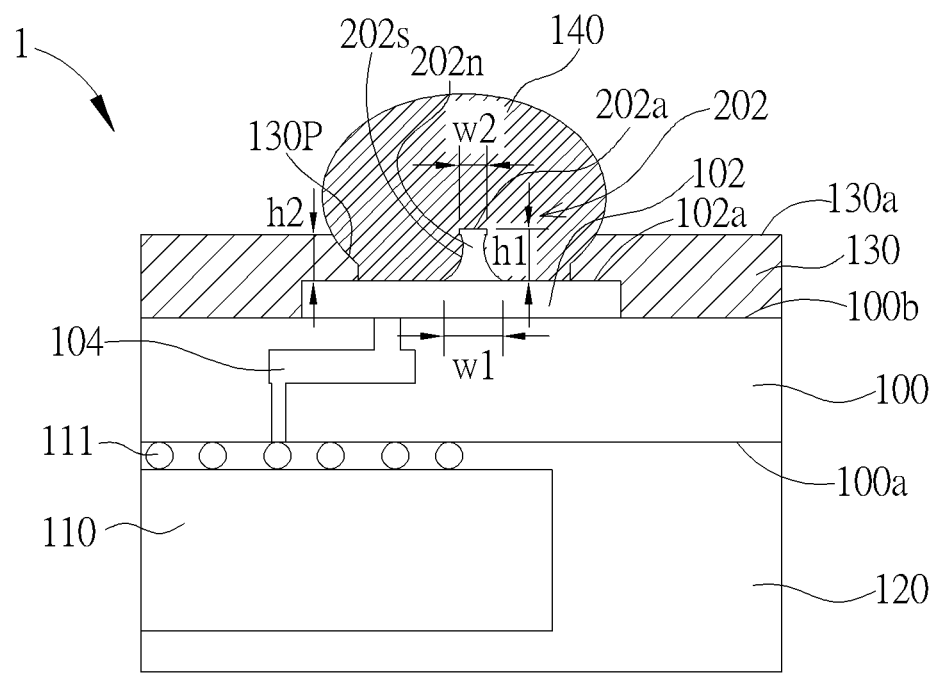
FIG. 2 is a schematic, cross-sectional taken along line I-I' in FIG. 1.

Please refer to FIG. 1 and FIG. 2. FIG. 1 is a perspective top view diagram showing a germane portion of an exemplary semiconductor package 1 in accordance with one embodiment of the invention. FIG. 2 is a schematic, cross-sectional taken along line I-I' in FIG. 1. As shown in FIG. 1 and FIG. 2, the semiconductor package 1 comprises a package substrate 100 having a component side (or chip side) 100a and a board side (or PCB side) 100b. The package substrate 100 may be cored substrate with a core layer or a coreless substrate. According to an embodiment, a semiconductor die (or die) 110 may be disposed on the component side 100a of the package substrate 100. The semiconductor die 110 is physically and electrically connected to the package substrate 100 through a plurality of connecting elements 111 such as copper pillar, micro-bumps or solder bumps, but not limited thereto.

According to an embodiment, the semiconductor die 110 may be over-molded by an encapsulant 120 such as a molding compound comprising epoxy resins. The encapsulant 120 is in direct contact with the package substrate 100. It is understood that the semiconductor package 1 may comprise multiple chips or dies in some embodiments. For the sake of simplicity, only a portion of the semiconductor die 110 is shown in the figures.

On the board side 100b of the package substrate 100, at least one conductive ball pad 102 is disposed. According to an embodiment, for example, the conductive ball pad 102 may be located at a corner of the semiconductor package 1. That is, the conductive ball pad 102 may be a corner ball pad disposed adjacent to a vertex of the rectangular shaped semiconductor package 1 when viewed from the bottom of the package 1. According to an embodiment, for example, the conductive ball pad 102 may be a copper pad. Depending upon design requirements, a surface solderable coating such as a nickel and/or gold coating or an organic solderability preservative (OSP) may be formed on the top surface of the conductive ball pad 102. According to an embodiment, the conductive ball pad 102 may be electrically connected to a corresponding connecting element 111 through an interconnection structure 104 in the package substrate 100. For example, the interconnection structure 104 may comprise copper traces and plated through vias, but not limited thereto.

According to an embodiment, the board side 100b of the package substrate 100 and a perimeter of the conductive ball pad 102 may be covered with a solder mask 130. The opening 130p of the solder mask 130 partially reveals a central top surface of the conductive ball pad 102. According to an embodiment, the conductive ball pad 102 comprises at least one conductive pillar 202 such as a copper pillar protruding from the top surface of the conductive ball pad 102. For example, the height h1 of the conductive pillar 202 above the top surface of the conductive ball pad 102 approximately equals to the height h2 of the solder mask 130 above the top surface of the conductive ball pad 102. According to an embodiment, a top surface 202a of the conductive pillar 202 may be flush with a top surface 130a of the solder mask 130. In some embodiment, multiple conductive pillars, for example, 2~3 pillars (only three exemplary copper pillars are shown in FIG. 1), may be disposed on the conductive ball pad 102. According to an embodiment, to form the conductive pillar 202, an extra plating process and a wet etching process are performed.

According to an embodiment, as cane be seen in FIG. 2, an undercut 202s is provided on the sidewall of the conductive pillar 202, thereby forming a curved sidewall profile. The undercut 202s may be formed by performing a wet etching process that has faster lateral etching rate, which provides a neck portion 202n that is thinner than its head 202h and base 202b. According to an embodiment, the neck portion 202n may have a smooth, curved surface. According to an embodiment, the base 202b of the conductive pillar 202 may have a width w1 that is greater than a width w2 of the head 202h of the conductive pillar 202. For example, the width (or diameter) w2 of the head 202b of the conductive pillar 202 may be about 50 micrometers, but not limited thereto. After the wet etching process is completed, an annular recess 120r may be formed on the conductive ball pad 102 and around the conductive pillar 202.

According to an embodiment, a conductive ball 140 such as a solder ball may be disposed on the conductive ball pad 102 and completely surrounds the conductive pillar 202. According to an embodiment, the conductive ball 140, the conductive pillar 202 and the conductive ball pad 102 may be subjected to a reflow process and an inter-metallic compound (IMC) layer (not explicitly shown) may be formed at an interface between the conductive pillar 202 and the conductive ball 140. According to an embodiment, the conductive pillar 202 and the conductive ball 140 interlock, and the conductive ball 140 is anchored to the conductive ball pad 102. The experimental results show that the 3D conductive ball pad 102 with the conductive pillar 202 increases the strength of the solder joint by at least 20%. The conductive ball pad with such conductive pillar 202 can significantly improve the board level reliability.

According to an embodiment, only the conductive ball pad at the corner of the semiconductor package 1 has such conductive pillar 202. According to some embodiments, each of the conductive ball pads of the semiconductor package 1 may have such conductive pillar 202.

Figure 3:
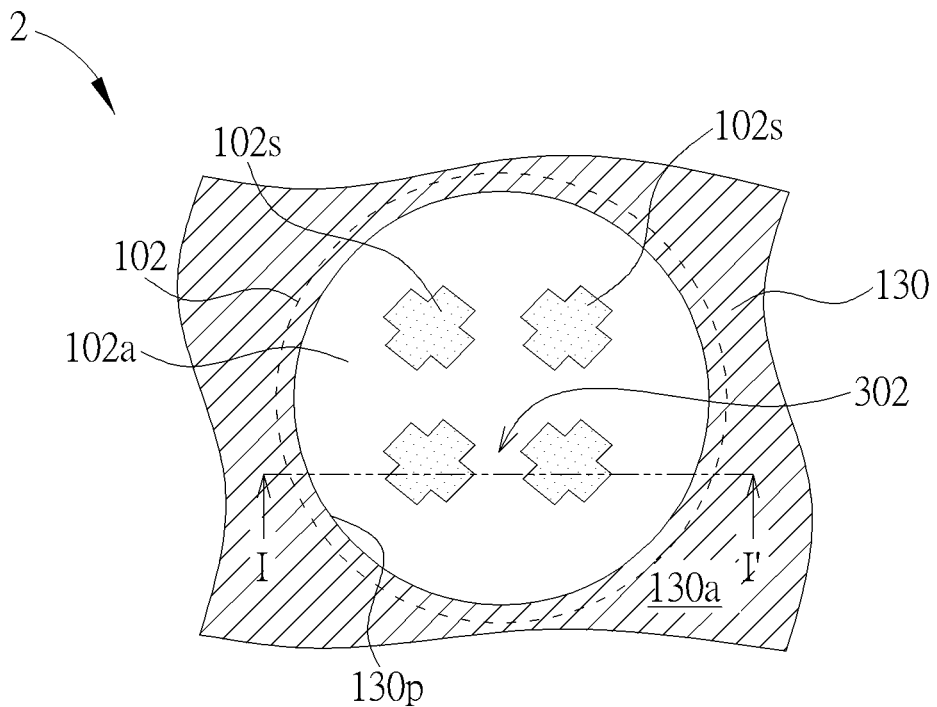
FIG. 3 demonstrates a schematic, top view of a conductive ball pad of an exemplary semiconductor package in accordance with another embodiment of the invention.
Figure 4:
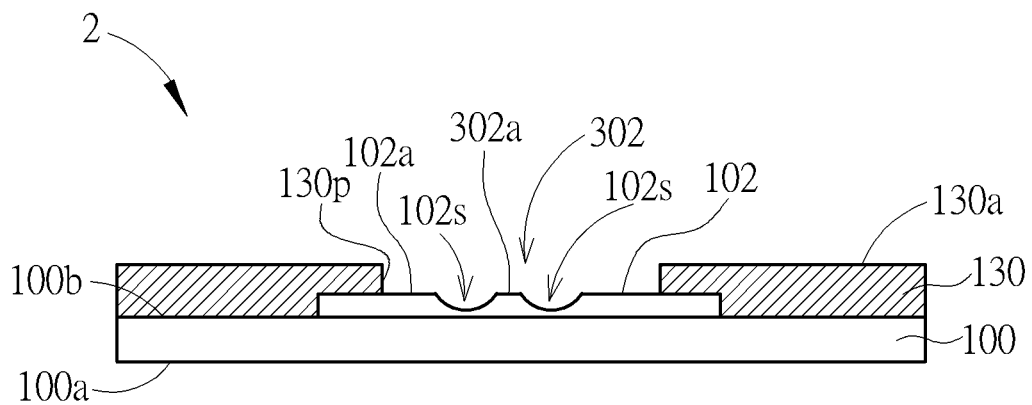
FIG. 4 is a schematic, cross-sectional view taken along line I-I' in FIG. 3.
Figure 5:
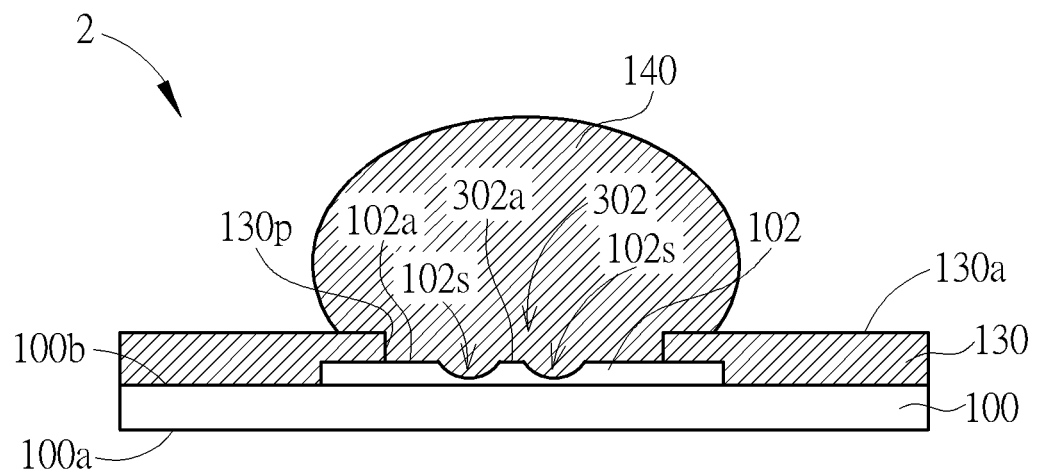
FIG. 5 shows the conductive ball pad of the semiconductor package in FIG. 4 after a conductive ball is mounted on the conductive ball pad.
Figure 6:
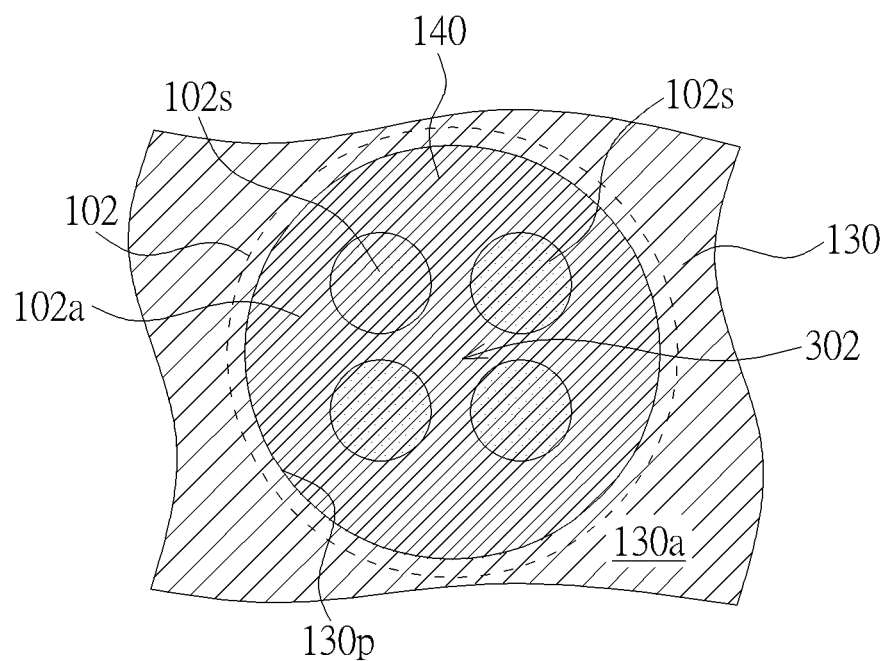
FIG. 6 and FIG. 7 show various recessed patterns on the conductive ball pad according to some embodiments.
Figure 7:
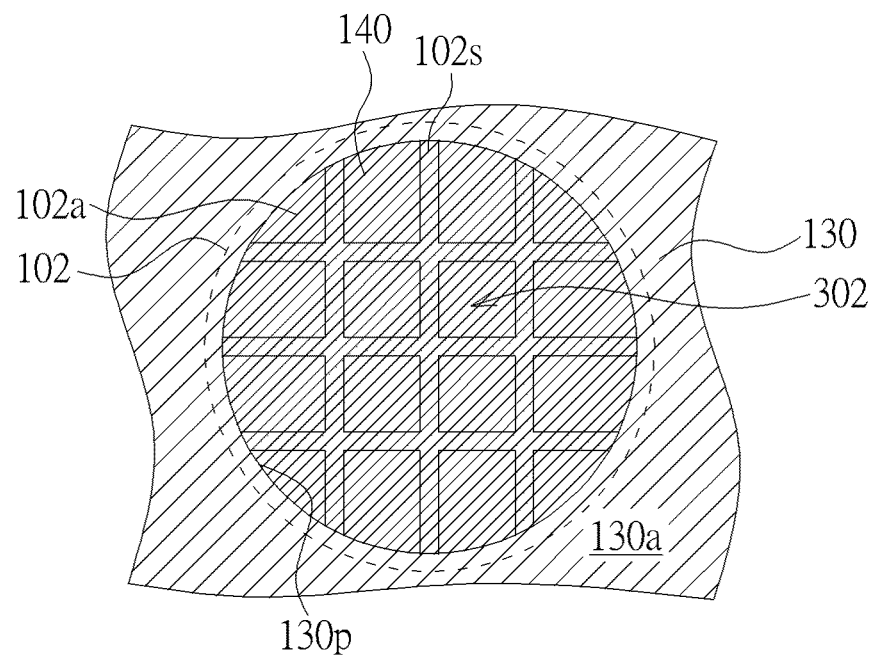

Please refer to FIG. 3 to FIG. 7. FIG. 3 demonstrates a schematic top view of a conductive ball pad of an exemplary semiconductor package 2 in accordance with another embodiment of the invention, wherein like layers, regions or elements are designated by like numeral numbers or labels. FIG. 4 is a schematic, cross-sectional view taken along line I-I' in FIG. 3, wherein the detailed structure below the package substrate is omitted in FIG. 4 for the sake of brevity. FIG. 5 shows the conductive ball pad of the semiconductor package in FIG. 4 after a conductive ball is mounted on the conductive ball pad. FIG. 6 and FIG. 7 show various recessed patterns on the conductive ball pad according to some embodiments.

As shown in FIG. 3 and FIG. 4, recessed regions 102s are provided on the top surface of the conductive ball pad 102. The recessed regions 102s are formed by selectively etching predetermined patterns into the top surface 102a of the conductive ball pad 102 using lithographic process and wet or dry etching methods known in the art, thereby forming a protruding feature 302 therebetween. For example, each of the recessed regions 102s may have a cross pattern when viewed from the above. According to an embodiment, the recessed regions 102s are isolated from one another by the protruding feature 302. In some embodiments, the recessed regions 102s may communicate with one another to form a network or interlacing pattern.

It is understood that the aerial patterns of the recessed regions 102s are for illustration purposes only. Other patterns such as circular patterns as depicted in FIG. 6 and grid type pattern as depicted in FIG. 7 are also applicable. The protruding feature 202 between the recessed regions 102s may have a top surface 302a that is flush with the top surface 102a of the conductive ball pad 102.

According to an embodiment, as shown in FIG. 6, likewise, a conductive ball 140 is disposed on the conductive ball pad 102 and completely surrounds the protruding feature 302. The recessed regions 102s are filled with the conductive ball 140. According to an embodiment, the conductive ball 140, the protruding feature 302 and the conductive ball pad 102 may be subjected to a reflow process and an inter-metallic compound (IMC) layer (not explicitly shown) may be formed at an interface between the protruding feature 302 and the conductive ball 140. According to an embodiment, the protruding feature 302 and the conductive ball 140 interlock and the conductive ball 140 is anchored to the conductive ball pad 102.

Figure 8:
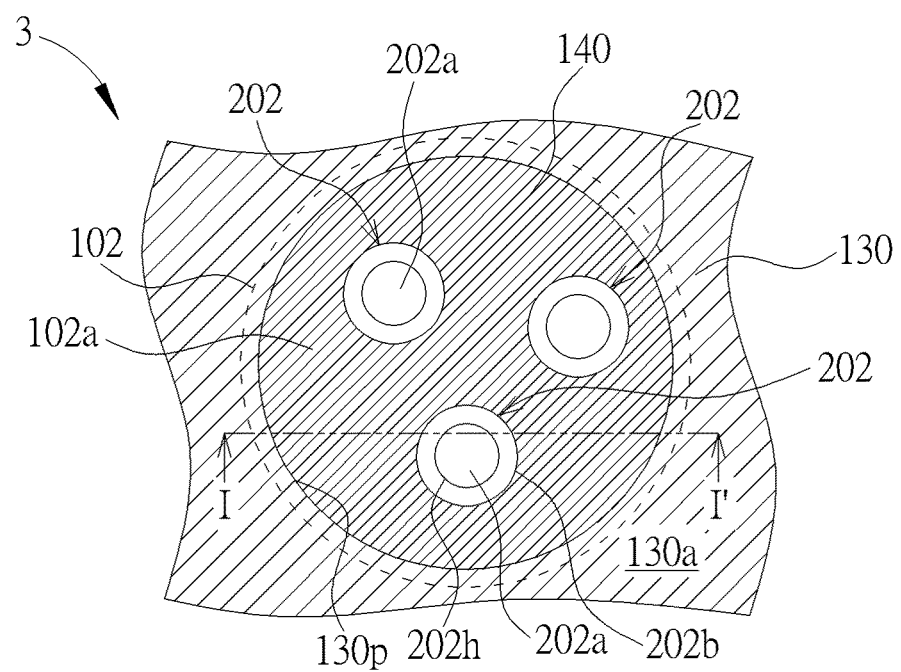
FIG. 8 is a perspective top view diagram showing a germane portion of an exemplary semiconductor package in accordance with another embodiment of the invention.
Figure 9:
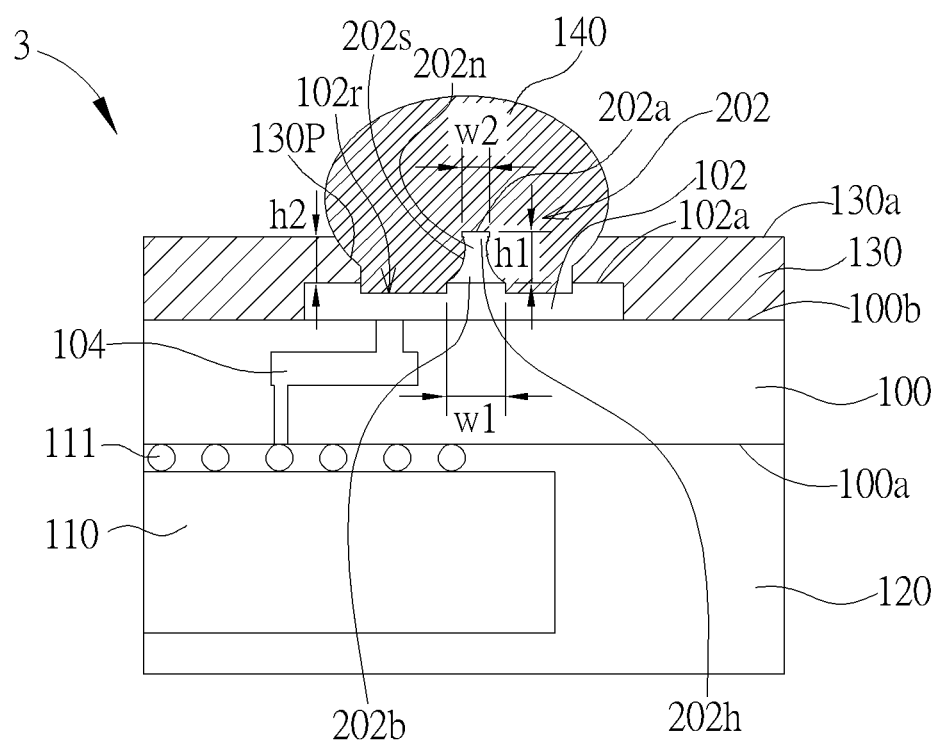
FIG. 9 is a schematic, cross-sectional taken along line I-I' in FIG. 8.

Please refer to FIG. 8 and FIG. 9. FIG. 8 is a perspective top view diagram showing a germane portion of an exemplary semiconductor package 3 in accordance with another embodiment of the invention. FIG. 9 is a schematic, cross-sectional taken along line I-I' in FIG. 8. As shown in FIG. 8 and FIG. 9, likewise, the semiconductor package 3 comprises a package substrate 100 having a component side (or chip side) 100a and a board side (or PCB side) 100b. The package substrate 100 may be cored substrate with a core layer or a coreless substrate. According to an embodiment, a semiconductor die (or die) 110 may be disposed on the component side 100a of the package substrate 100. The semiconductor die 110 is physically and electrically connected to the package substrate 100 through a plurality of connecting elements 111 such as copper pillar, micro-bumps or solder bumps, but not limited thereto.

According to an embodiment, the semiconductor die 110 may be over-molded by an encapsulant 120 such as a molding compound comprising epoxy resins. The encapsulant 120 is in direct contact with the package substrate 100. It is understood that the semiconductor package 3 may comprise multiple chips or dies in some embodiments. For the sake of simplicity, only a portion of the semiconductor die 110 is shown in the figures.

On the board side 100b of the package substrate 100, at least one conductive ball pad 102 is disposed. According to an embodiment, for example, the conductive ball pad 102 may be located at a corner of the semiconductor package 3. That is, the conductive ball pad 102 may be a corner ball pad disposed adjacent to a vertex of the rectangular shaped semiconductor package 3 when viewed from the bottom of the package 3. According to an embodiment, for example, the conductive ball pad 102 may be a copper pad. Depending upon design requirements, a surface solderable coating such as a nickel and/or gold coating or an organic solderability preservative (OSP) may be formed on the top surface of the conductive ball pad 102. According to an embodiment, the conductive ball pad 102 may be electrically connected to a corresponding connecting element 111 through an interconnection structure 104 in the package substrate 100. For example, the interconnection structure 104 may comprise copper traces and plated through vias, but not limited thereto.

According to an embodiment, the board side 100b of the package substrate 100 and a perimeter of the conductive ball pad 102 may be covered with a solder mask 130. The opening 130p of the solder mask 130 partially reveals a central top surface of the conductive ball pad 102. According to an embodiment, the conductive ball pad 102 comprises at least one conductive pillar 202 such as a copper pillar protruding from the top surface of the conductive ball pad 102. For example, the height h1 of the conductive pillar 202 above the top surface of the conductive ball pad 102 approximately equals to the height h2 of the solder mask 130 above the top surface of the conductive ball pad 102. According to an embodiment, a top surface 202a of the conductive pillar 202 may be flush with a top surface 130a of the solder mask 130. In some embodiment, multiple conductive pillars, for example, 2~3 pillars (only three exemplary copper pillars are shown in FIG. 8), may be disposed on the conductive ball pad 102. According to an embodiment, to form the conductive pillar 202, an extra plating process and a wet etching process are performed.

According to an embodiment, as cane be seen in FIG. 9, an undercut 202s is provided on the sidewall of the conductive pillar 202, thereby forming a curved sidewall profile. The undercut 202s may be formed by performing a wet etching process that has faster lateral etching rate, which provides a neck portion 202n that is thinner than its head 202h and base 202b. According to an embodiment, the neck portion 202n may have a smooth, curved surface. According to an embodiment, the base 202b of the conductive pillar 202 may have a width w1 that is greater than a width w2 of the head 202h of the conductive pillar 202. For example, the width (or diameter) w2 of the head 202b of the conductive pillar 202 may be about 50 micrometers, but not limited thereto. After the wet etching process is completed, an annular recess 120r may be formed on the conductive ball pad 102 and around the conductive pillar 202.

According to an embodiment, a conductive ball 140 such as a solder ball may be disposed on the conductive ball pad 102 and completely surrounds the conductive pillar 202. According to an embodiment, the conductive ball 140, the conductive pillar 202 and the conductive ball pad 102 may be subjected to a reflow process and an inter-metallic compound (IMC) layer (not explicitly shown) may be formed at an interface between the conductive pillar 202 and the conductive ball 140. According to an embodiment, the conductive pillar 202 and the conductive ball 140 interlock, and the conductive ball 140 is anchored to the conductive ball pad 102.

According to an embodiment, recessed regions 102r are provided on the top surface of the conductive ball pad 102 and around the conductive pillar 202. The recessed regions 102r are formed by selectively etching predetermined patterns into the top surface 102a of the conductive ball pad 102 using lithographic process and wet or dry etching methods known in the art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional pad structure, comprising:
   a substrate;
   a pad disposed on the substrate, wherein a perimeter of the pad is covered with a solder mask;
   at least one conductive pillar protruding from a top surface of the pad, wherein an undercut is disposed on a sidewall of the at least one conductive pillar, thereby constituting a curved sidewall profile, wherein a height of the at least one conductive pillar above the top surface of the pad equals to a height of the solder mask above the top surface of the pad; and
   a solder ball disposed on the pad, wherein the solder ball surrounds the at least one conductive pillar, wherein the at least one conductive pillar and the solder ball interlock, and wherein the solder ball is anchored to the pad.

2. The three-dimensional pad structure according to claim 1, wherein the substrate is a package substrate having a component side and a board side, wherein the pad is disposed on the board side of the package substrate.

3. The three-dimensional pad structure according to claim 1, wherein the pad is a copper pad.

4. The three-dimensional pad structure according to claim 1, wherein the at least one conductive pillar is a copper pillar.

5. The three-dimensional pad structure according to claim 1, wherein a height of the at least one conductive pillar above the top surface of the pad equals to a height of the solder mask above the top surface of the pad.

6. The three-dimensional pad structure according to claim 1 further comprising:
   a surface solderable coating or an organic solderability preservative (OSP) on the top surface of the pad.

7. The three-dimensional pad structure according to claim 1, wherein a top surface of the at least one conductive pillar is flush with a top surface of the solder mask.

8. The three-dimensional pad structure according to claim 1, wherein the at least one conductive pillar comprises a neck portion that is thinner than its head and base.

9. The three-dimensional pad structure according to claim 8, wherein the neck portion has a smooth, curved surface.

10. The three-dimensional pad structure according to claim 8, wherein a width of the head of the at least one conductive pillar is 50 micrometers.

11. The three-dimensional pad structure according to claim 1 further comprising:
    an annular recess on the pad and around the at least one conductive pillar.

12. An interconnection structure, comprising:
    a substrate;
    a pad disposed on the substrate, wherein a perimeter of the pad is covered with a solder mask;
    at least one conductive pillar protruding from a top surface of the pad, wherein an undercut is disposed on a sidewall of the at least one conductive pillar, thereby constituting a curved sidewall profile, wherein a height of the at least one conductive pillar above the top surface of the pad equals to a height of the solder mask above the top surface of the pad; and
    a conductive ball disposed on the pad and surrounds the conductive pillar, wherein the at least one conductive pillar and the conductive ball interlock, and wherein the conductive ball is anchored to the pad.

13. The interconnection structure according to claim 12, wherein the conductive ball completely surrounds the at least one conductive pillar.

14. The interconnection structure according to claim 12, wherein the substrate is a package substrate having a component side and a board side, wherein the pad is disposed on the board side of the package substrate.

15. The interconnection structure according to claim 12, wherein the pad is a copper pad.

16. The interconnection structure according to claim 12, wherein the at least one conductive pillar is a copper pillar.

17. The interconnection structure according to claim 12 further comprising:
   a surface solderable coating or an organic solderability preservative (OSP) on the top surface of the pad.

18. The interconnection structure according to claim 12, wherein the at least one conductive pillar comprises a neck portion that is thinner than its head and base.

19. The interconnection structure according to claim 18, wherein the neck portion has a smooth, curved surface.

20. The interconnection structure according to claim 18, wherein a width of the head of the at least one conductive pillar is 50 micrometers.

21. The interconnection structure according to claim 12 further comprising:
   an annular recess on the pad and around the at least one conductive pillar.

22. The interconnection structure according to claim 12, wherein the pad is a copper pad.

23. A three-dimensional pad structure, comprising:
   a substrate;
   a pad disposed on the substrate, wherein a perimeter of the pad is covered with a solder mask; and
   recessed regions provided on a top surface of the pad, wherein the recessed regions are interconnected with one another to form a network or interlacing pattern; and
   at least one protruding feature between the recessed regions.

24. The three-dimensional pad structure according to claim 23, wherein the recessed regions are isolated from one another by the protruding feature.

25. The three-dimensional pad structure according to claim 23, wherein the protruding feature between the recessed regions has a top surface that is flush with the top surface of the pad.

26. The three-dimensional pad structure according to claim 23, wherein the substrate is a package substrate having a component side and a board side, wherein the pad is disposed on the board side of the package substrate.

27. The three-dimensional pad structure according to claim 23, wherein the pad is a copper pad.

* * * * *